(12) United States Patent
Ke et al.

(10) Patent No.: US 8,563,996 B2
(45) Date of Patent: Oct. 22, 2013

(54) LUMINESCENT LIGHT SOURCE HAVING BLUE LIGHT EMITTING DIODE CHIP AND RED LIGHT EMITTING DIODE CHIP

(75) Inventors: Wei-Chih Ke, New Taipei (TW); Ruei-Teng Lin, Keelung (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 13/401,777

(22) Filed: Feb. 21, 2012

(65) Prior Publication Data

US 2013/0113003 A1  May 9, 2013

(30) Foreign Application Priority Data

Nov. 9, 2011 (TW) .............................. 100140881 A

(51) Int. Cl.
*H01L 29/20* (2006.01)
*H01L 33/00* (2010.01)
*H01L 29/201* (2006.01)

(52) U.S. Cl.
USPC ........................ 257/89; 257/90; 257/E51.022

(58) Field of Classification Search
USPC ....................................... 257/89, 90, E51.022
See application file for complete search history.

(56) References Cited

U.S. PATENT DOCUMENTS

| | | | | |
|---|---|---|---|---|
| 5,573,107 A * | 11/1996 | Nakano et al. | ................. | 200/314 |
| 5,841,128 A * | 11/1998 | Shibuya et al. | ............. | 250/208.1 |
| 6,008,506 A * | 12/1999 | Morikawa | ....................... | 257/85 |
| 6,249,370 B1 * | 6/2001 | Takeuchi et al. | .............. | 359/291 |
| 7,005,679 B2 * | 2/2006 | Tarsa et al. | ....................... | 257/89 |
| 7,564,180 B2 | 7/2009 | Brandes | | |
| 8,338,839 B2 * | 12/2012 | Lerman et al. | ................... | 257/88 |
| 8,378,375 B2 * | 2/2013 | Lee | .................. | 257/99 |
| 2005/0280785 A1 * | 12/2005 | Beeson et al. | .................. | 353/97 |
| 2006/0158090 A1 * | 7/2006 | Wang et al. | .................... | 313/485 |
| 2006/0186425 A1 * | 8/2006 | Yano et al. | ....................... | 257/98 |
| 2007/0001188 A1 | 1/2007 | Lee | | |
| 2008/0180948 A1 * | 7/2008 | Yoon et al. | .................... | 362/230 |
| 2008/0237614 A1 * | 10/2008 | Ishikura et al. | ................. | 257/89 |
| 2008/0308822 A1 | 12/2008 | Tsang et al. | | |
| 2009/0195137 A1 | 8/2009 | Brandes | | |
| 2010/0301367 A1 * | 12/2010 | Nakamura et al. | .............. | 257/98 |
| 2011/0089810 A1 * | 4/2011 | Su | .................. | 313/483 |
| 2011/0215349 A1 * | 9/2011 | An et al. | ......................... | 257/89 |
| 2011/0228514 A1 * | 9/2011 | Tong et al. | ....................... | 362/84 |
| 2012/0138978 A1 * | 6/2012 | Tsang | ............................. | 257/89 |

(Continued)

FOREIGN PATENT DOCUMENTS

CN    1783521 A    6/2006

OTHER PUBLICATIONS

"First Office Action of China Counterpart Application", issued on Jan. 30, 2013, p. 1-p. 6.

*Primary Examiner* — Ida M Soward
(74) *Attorney, Agent, or Firm* — Jianq Chyun IP Office

(57) ABSTRACT

A luminescent light source including a blue light emitting diode (LED) chip, a red LED chip, and a wavelength converting material is provided. The blue LED chip and the red LED chip respectively emit a first light and a second light. A ratio of peak intensity of the second light to peak intensity of the first light ranges from 0.36 to 0.56. The wavelength converting material is disposed around the blue LED chip or the red LED chip and emits a third light. A wavelength of the third light ranges from a wavelength of the first light to a wavelength of the second light.

19 Claims, 7 Drawing Sheets

(56) References Cited

U.S. PATENT DOCUMENTS

| | | | |
|---|---|---|---|
| 2012/0155076 A1* | 6/2012 | Li et al. | 362/231 |
| 2012/0211781 A1* | 8/2012 | Lee et al. | 257/89 |
| 2012/0306356 A1* | 12/2012 | Yoon et al. | 313/503 |
| 2012/0319565 A1* | 12/2012 | Sakuta et al. | 313/503 |
| 2013/0056772 A9* | 3/2013 | Lu et al. | 257/98 |

* cited by examiner

LUMINESCENT LIGHT SOURCE HAVING BLUE LIGHT EMITTING DIODE CHIP AND RED LIGHT EMITTING DIODE CHIP

CROSS-REFERENCE TO RELATED APPLICATION

This application claims the priority benefit of Taiwan application serial no. 100140881, filed on Nov. 9, 2011. The entirety of the above-mentioned patent application is hereby incorporated by reference herein and made a part of this specification.

BACKGROUND

1. Technical Field

The disclosure relates to a luminescent light source and a display having the luminescent light source.

2. Description of Related Art

In the field of colorimetry, white light often serves as a reference to color decomposition and color rendition. In a color TV system, the image retrieval terminal and the image display terminal should determine a standard white light as the reference to color image transmission. If the white light exhibited on a display is not the standard white light, color shift issues are prone to arise in images displayed on the display. According to the existing color television broadcast standard and the color TV receiver-color temperature of white point-reference white and it's tolerance, the D65 white field color temperature is set as the standard white for decomposition, transmission, and rendition of color TV signals. The chromaticity coordinate CIEx of D65 is 0.313, and the chromaticity coordinate CIEy of D65 is 0.329. As to a non-self-illuminating display, proper selection of a white light backlight module can enhance color performance of the display, so as to comply with the standard developed by the National Television System Committee (NTSC), and the standard hereinafter is referred to as the NTSC standard.

Along with the increasing progress of semiconductor science and technology, the light emitting diode (LED) today has many advantages, such as output with high luminance, low power consumption, small volume occupancy, low driving voltage, and mercury-free content. Therefore, the LED has been extensively applied in the field of displays. A common white LED device includes a blue LED and phosphor materials with a color different from blue. After the phosphor materials are excited by a portion of the blue light, color light different from the blue light is emitted. The non-blue color light emitted by the phosphor materials is mixed with the residual blue light to generate the white light, and this is the most common technique for generating white light at the current stage. Even though various phosphor materials have been developed to be combined with a single LED chip with a certain wavelength for constituting the white LED device, the combination of one known LED chip and phosphor materials with two colors does not render satisfactory color performance.

SUMMARY

The embodiments of the invention are directed to a luminescent light source capable of emitting appropriate standard white light and a display panel having the luminescent light source, so as to achieve favorable color performance.

In the embodiment of the invention, a luminescent light source including a blue light emitting diode (LED) chip, a red LED chip, and a wavelength converting material is provided. The blue LED chip and the red LED chip respectively emit a first light and a second light. A ratio of peak intensity of the second light to peak intensity of the first light ranges from 0.36 to 0.56. The wavelength converting material is disposed around the blue LED chip or the red LED chip and emits a third light. A wavelength of the third light ranges from a wavelength of the first light to a wavelength of the second light.

According to an embodiment of the invention, the luminescent light source further includes a driver source outputting an electrical signal to drive the blue LED chip and the red LED chip.

According to an embodiment of the invention, the first light, the second light, and the third light are mixed to generate a white light.

According to an embodiment of the invention, a light emitting area of the blue LED chip is greater than a light emitting area of the red LED chip.

According to an embodiment of the invention, the wavelength converting material is green phosphor powder, yellow phosphor powder, or a combination thereof.

According to an embodiment of the invention, the wavelength converting material includes an orthosilicate phosphor material, β-SiAlON, an oxynitride-based phosphor material, an yttrium aluminum garnet (YAG) phosphor material, a nitride phosphor material, a sulfate phosphor material, $CaSc_2O_4$, or a combination thereof.

According to an embodiment of the invention, an NTSC color saturation of the white light is greater than 90%.

According to an embodiment of the invention, the luminescent light source further includes an encapsulant encapsulating the blue LED chip and the red LED chip.

According to an embodiment of the invention, the wavelength converting material is doped into the encapsulant.

According to an embodiment of the invention, peripheries of the blue LED chip are coated with the wavelength converting material.

According to an embodiment of the invention, a light emitting surface of the blue LED chip is coated with the wavelength converting material.

According to an embodiment of the invention, the blue LED chip and the red LED chip are connected in series or in parallel.

According to an embodiment of the invention, the ratio of the peak intensity of the second light to the peak intensity of the first light ranges from 0.46 to 0.56.

According to an embodiment of the invention, the ratio of the peak intensity of the second light to the peak intensity of the first light ranges from 0.36 to 0.44.

In the invention, a display including a display panel and a luminescent light source is provided. The display panel has a color filter layer. The luminescent light source provides the display panel with a display light. The luminescent light source includes a blue LED chip, a red LED chip, and a wavelength converting material. The blue LED chip emits a first light, and the red LED chip emits a second light. Here, a ratio of peak intensity of the second light to peak intensity of the first light ranges from 0.36 to 0.56. The wavelength converting material is disposed around the blue LED chip or the red LED chip and can be excited to emit a third light. Here, the first light, the second light, and the third light are mixed to generate the display light. The display light has an x-coordinate CIEx and a y-coordinate CIEy on a CIE 1931 chromaticity coordinate diagram after passing through the color filter layer, wherein CIEx ranges from 0.265 to 0.328, and CIEy ranges from 0.273 to 0.344.

According to an embodiment of the invention, the display light has the x-coordinate CIEx and the y-coordinate CIEy on the CIE 1931 chromaticity coordinate diagram after passing through the color filter layer, wherein CIEx ranges from 0.298 to 0.328, and CIEy ranges from 0.314 to 0.344.

According to an embodiment of the invention, the display light has the x-coordinate CIEx and the y-coordinate CIEy on the CIE 1931 chromaticity coordinate diagram after passing through the color filter layer, wherein CIEx ranges from 0.265 to 0.295, and CIEy ranges from 0.273 to 0.303.

According to an embodiment of the invention, the ratio of the peak intensity of the second light of the luminescent light source to the peak intensity of the first light of the luminescent light source ranges from 0.46 to 0.56.

According to an embodiment of the invention, the ratio of the peak intensity of the second light of the luminescent light source to the peak intensity of the first light of the luminescent light source ranges from 0.36 to 0.44.

Based on the above, the blue LED chip and the red LED chip of the luminescent light source can be simultaneously driven by only one driver source according to the embodiments of the invention, thus simplifying the design of the driving circuit. Besides, the ratio of the peak intensity of the light from the red LED chip to the peak intensity of the light from the blue LED chip is appropriate, such that the display panel is capable of displaying proper color images by applying the appropriate white light emitted from the luminescent light source.

In order to make the aforementioned and other features and advantages of the invention more comprehensible, embodiments accompanying figures are described in detail below.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the invention.

DESCRIPTION OF EMBODIMENTS

Figure 1A:
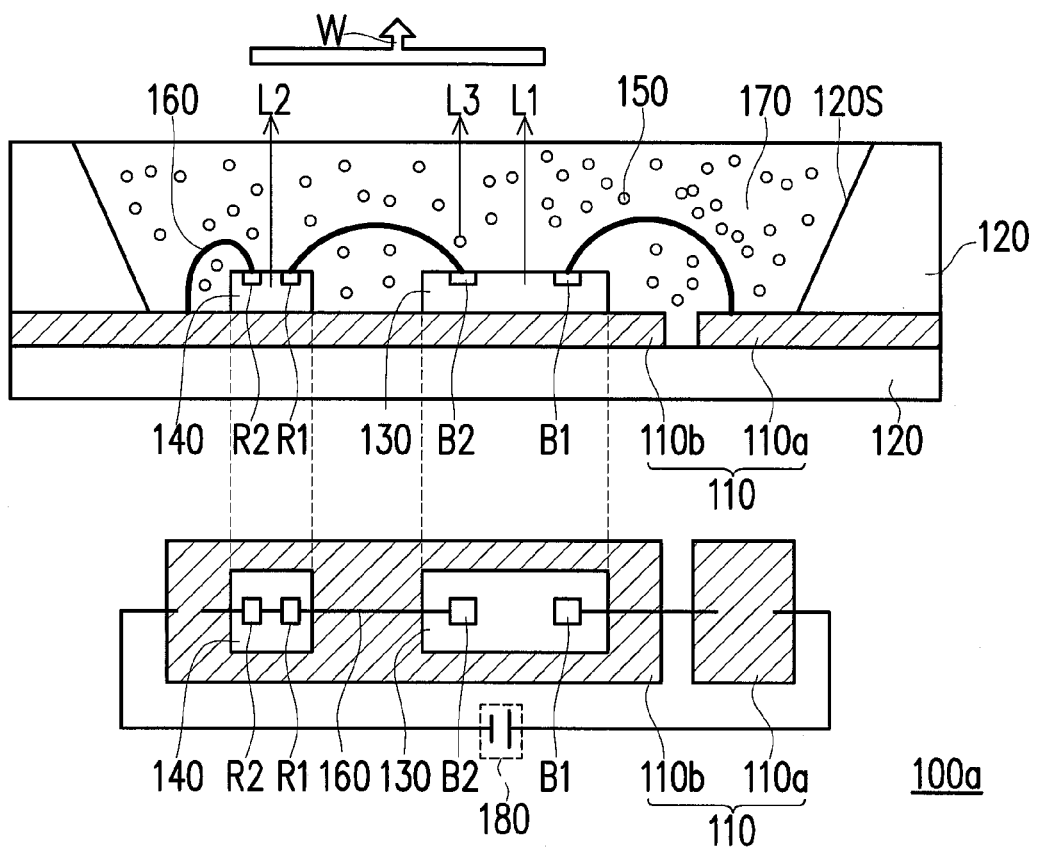
FIG. 1A is a schematic view illustrating a luminescent light source according to an embodiment of the invention.

FIG. 1A shows a luminescent light source according to an embodiment of the invention. The upper portion and the lower portion are respectively a schematic cross-sectional view and a schematic partial top view of the luminescent light source according to an embodiment of the invention. With reference to FIG. 1A, the luminescent light source 100a of the present embodiment includes a blue LED chip 130, a red LED chip 140, and a wavelength converting material 150. According to this embodiment, the luminescent light source 100a further includes a carrier 110 and a molding structure 120. The blue LED chip 130 and the red LED chip 140 are configured on the carrier 110. The carrier 110 further includes a first electrode conductive structure 110a and a second electrode conductive structure 110b. The blue LED chip 130 and the red LED chip 140 are configured on the second electrode conductive structure 110b, which should however not be construed as a limitation to the invention. Note that the wavelength converting material 150 is not shown in the lower portion of FIG. 1A in order to clearly illustrate the configuration of the chips and the conductive structures.

According to this embodiment, the carrier 110 is, for instance, a lead frame and is constituted by the first electrode conductive structure 110a and the second electrode conductive structure 110b. According to other embodiments of the invention, the carrier 110 may be any known carrier, e.g., a circuit board or any other substrate structure. The blue LED chip 130 configured on the carrier 110 is electrically connected to the conductive structure (e.g., an electrode pad or a conductive layer) in the carrier 110. In this embodiment, the blue LED chip 130 is electrically connected to the conductive structure in the carrier 110 through wire bonding. However, the invention is not limited thereto. In other embodiments of the invention, the blue LED chip 130 may also be electrically connected to the conductive structure in the carrier 100 in other manner of electrical connection (e.g., through a conductive bump).

The molding structure 120 covers the carrier 100 according to this embodiment, and the molding structure 120 can be formed by performing an injection molding process. Specifically, the molding structure 120 has an accommodation space 120S, and the blue LED chip 130 is configured in the accommodation space 120S of the molding structure 120. However, in another embodiment of the invention, it is likely not to form the molding structure 120, i.e., the blue LED chip 130 is simply configured on the carrier 110. Besides, the molding structure 120 of this embodiment has a cup-like shape, while the molding structure 120 may be shaped in another way according to another embodiment.

In the present embodiment, the luminescent light source 100a further includes an encapsulant 170. The encapsulant 170 covers the blue LED chip 130 and the red LED chip 140 and may be fabricated by silicone, epoxy resin, or other transparent adhesive materials. In this embodiment, the accommodation space 120S of the molding structure 120 is filled with the encapsulant 170 to cover the blue LED chip 130. The upper surface of the encapsulant 170 and the upper surface of the molding structure 120 are co-planar in this embodiment, while the invention is not limited thereto. According to another embodiment, the upper surface of the encapsulant 170 may protrude from or recess into the upper surface of the molding structure 120. Alternatively, if no molding structure 120 is configured on the carrier 100, the encapsulant 170 may be directly dispensed on the blue LED chip 130 and the red LED chip 140.

The wavelength converting material 150 is disposed around at least one of the blue LED chip 130 and the red LED chip 140. In this embodiment, the wavelength converting material 150 is able to emit light after being excited, and a wavelength of the light emitted from the wavelength converting material 150 ranges from a wavelength of red light and a wavelength of blue light. For instance, the wavelength converting material 150 is green phosphor powder and may include an orthosilicate phosphor material, β-SiAlON, an oxynitride-based phosphor material, a yttrium aluminum garnet (YAG) phosphor material, a nitride phosphor material, a sulfate phosphor material, $CaSc_2O_4$, or a combination thereof. According to another embodiment, the wavelength converting material 150 may be a mixture of phosphor powder with various colors. For instance, the wavelength converting material 150 may be a mixture of the green phosphor powder and the yellow phosphor powder. In other words, the wavelength converting material 150 is not limited to one single type or one single color. According to the present embodiment, the wavelength converting material 150 is doped into the encapsulant 170. Specifically, the wavelength converting material 150 is mixed with a gel solution constituting the encapsulant 170, and the accommodation space 120S of the molding structure 120 is then filled with the mixture. Therefore, in the present embodiment, the wavelength converting material 150 may be evenly distributed into the encapsulant 170, as indicated in FIG. 1A; namely, the wavelength converting material 150 is disposed around both the blue LED chip 130 and the red LED chip 140. However, the invention is not limited thereto.

Figure 1B:
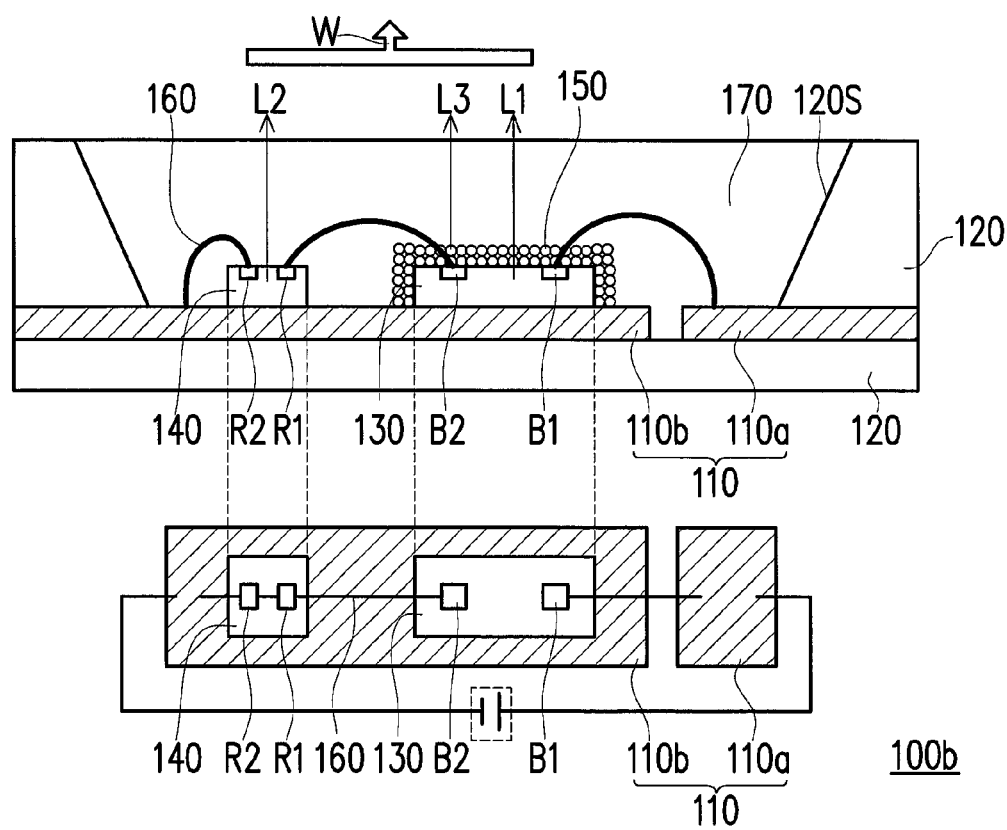
FIG. 1B is a schematic view illustrating a luminescent light source according to another embodiment of the invention.

FIG. 1B is a schematic view illustrating a luminescent light source 100b according to another embodiment of the invention. With reference to FIG. 1B, the wavelength converting material 150 may be distributed into the encapsulant 170 in a conformal coating manner according to this embodiment. In the embodiment, the wavelength converting material 150 is disposed on or around the surface of the blue chip 130. That is, the wavelength converting material 150 mainly absorbs the light emitted from the blue LED chip 130, and the probability of absorbing the light emitted or the shield of the light emitted from the red LED chip 140 can be reduced. It is also likely for the wavelength converting material 150 to be completely irradiated by the blue LED chip 130. As such, the luminescent light source 100b of this embodiment is able to emit light combined by different color light with uniform intensity. As provided in the embodiment shown in FIG. 1B, when the wavelength converting material 150 capable of being excited by blue light is applied, the wavelength converting material 150 is disposed on the surface of the blue LED chip 130. However, the invention is not limited thereto. For instance, when the wavelength converting material 150 can be excited by red light, the wavelength converting material 150 may be disposed on the surface of the red LED chip 140.

Figure 1C:
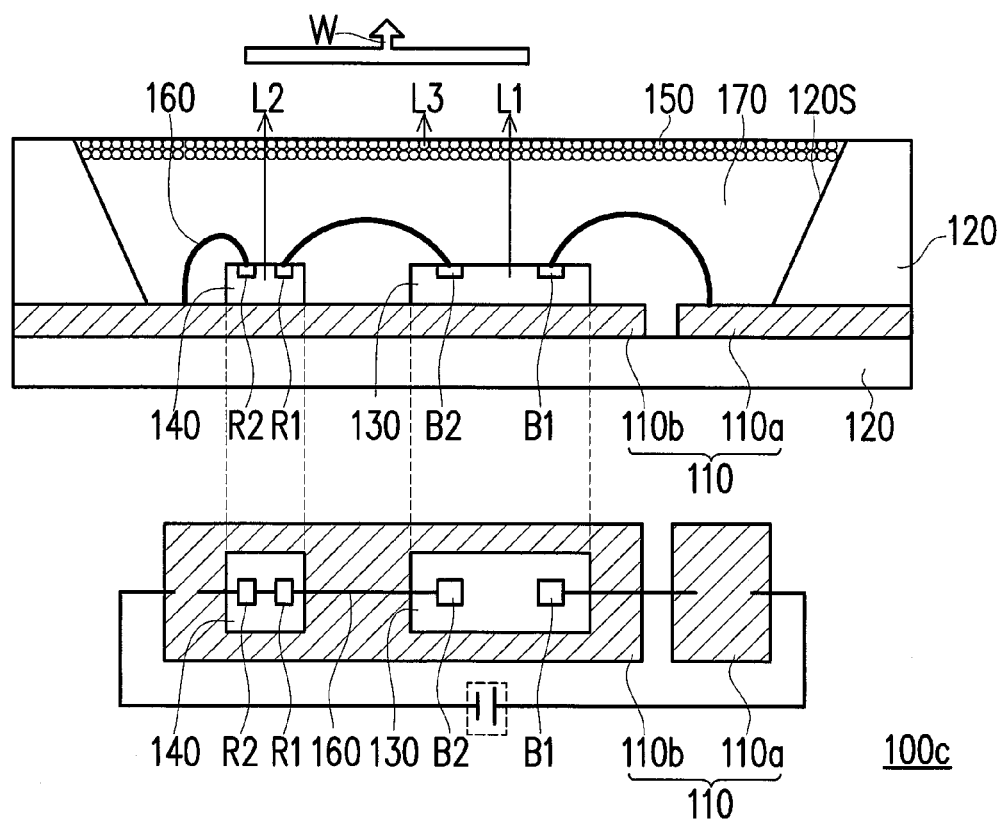
FIG. 1C is a schematic view illustrating a luminescent light source according to another embodiment of the invention.

FIG. 1C includes a schematic cross-sectional view and a schematic top view of a luminescent light source 100c according to another embodiment of the invention. With reference to FIG. 1C, the wavelength converting material 150 may be distributed into the encapsulant 170 in form of remote phosphor. Namely, the wavelength converting material 150 is coated over the light emitting surface of the blue LED chip 130 without being in physical contact with the blue LED chip 140. In the embodiment, the converting material 150 is coated over the light emitting surface of the luminescent light source 100c. Thereby, the luminescent light source 100c of this embodiment can be characterized by favorable luminescent efficiency. According to the embodiment shown in FIG. 1C, the wavelength converting material 150 is disposed on the entire light emitting surface of the luminescent light source 100c, while the wavelength converting material 150 may be disposed on a portion of the light emitting surface in another embodiment of the invention. For instance, when the wavelength converting material 150 capable of being excited by blue light is applied, the wavelength converting material 150 may be merely disposed on the light emitting surface corresponding to the top of the blue LED chip 130. That is to say, the wavelength converting material 150 and the blue LED chip 130 have the overlapping area in a vertical projection direction on the light emitting surface, while the wavelength converting material 150 and the red LED chip 140 do not have the overlapping area in the vertical projection direction on the light emitting surface.

With reference to FIG. 1A, in the present embodiment, the luminescent light source 100a further includes a driver source 180. The driver source 180 is electrically connected to the conductive structures in the carrier 110, and so are the blue LED chip 130 and the red LED chip 140. Hence, the electrical signal output from the driver source 180 may be transmitted through the conductive structures in the carrier 110, so as to drive the blue LED chip 130 and the red LED chip 140 to emit light.

According to this embodiment, the blue LED chip 130 and the red LED chip 140 are connected in series. In particular, the first electrode conductive structure 110a in the carrier 110 is connected to a first electrode B1 of the blue LED chip 130 through a wire 160, a second electrode B2 of the blue LED chip 130 is connected to a first electrode R1 of the red LED chip 140 through another wire 160, and a second electrode R2 of the red LED chip 140 is connected to the second electrode conductive structure 110b in the carrier 110 through further another wire 160, thus resulting in the serial connection. Accordingly, only one driver source 180 is required for simultaneously driving the blue LED chip 130 and the red LED chip 140. Since no plural driver sources are needed to drive the blue LED chip 130 and the red LED chip 140 at the same time, the costs on the luminescent light source can be lowered down. Note that the serial connection is applicable to a driving circuit with low current but high voltage.

Figure 2:
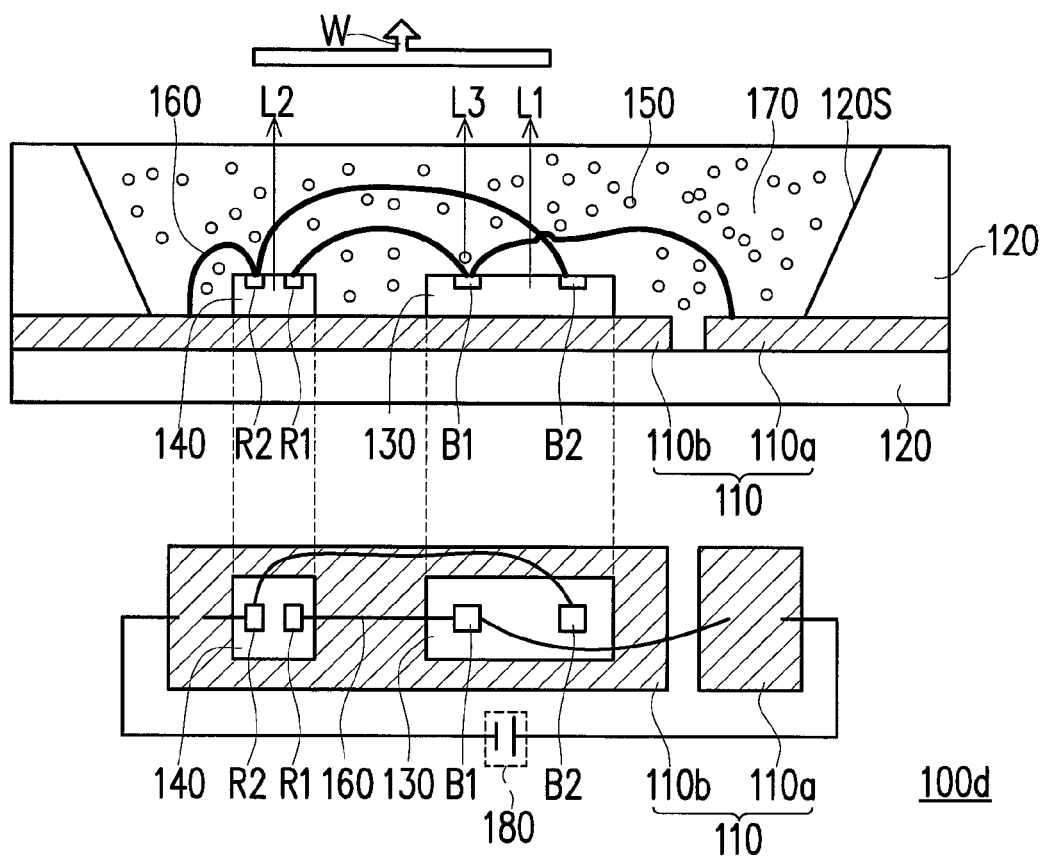
FIG. 2 is a schematic view illustrating a luminescent light source according to another embodiment of the invention.

However, the invention is not limited thereto, and please refer to FIG. 2, which includes a schematic cross-sectional view and a schematic top view of a luminescent light source 100d according to another embodiment of the invention. The components of the luminescent light source 100d are similar to those described above, and therefore the same or similar reference numbers represent the same components. The detailed descriptions regarding the materials and the configurations can be referred to as those provided in the previous embodiments and will not be further elaborated. With reference to FIG. 2, in this embodiment, the components and the configurations of the luminescent light source 100d are similar to those provided in the previous embodiments, while the difference lies in that the blue LED chip 130 and the red LED chip 140 of the luminescent light source 100d are electrically connected to the conductive structures in the carrier 110 in parallel. In particular, the first electrode conductive structure 110a in the carrier 110 is connected to the first electrode B1 of the blue LED chip 130, the second electrode B2 of the blue LED chip 130 is connected to the second electrode R2 of the red LED chip 140, the first electrode B1 of the blue LED chip 130 is connected to the first electrode R1 of the red LED chip 140, and the second electrode R2 of the red LED chip 140 is connected to the second electrode conductive structure 110b in the carrier 110, thus resulting in the parallel connection. Note that the parallel connection is applicable to a driving circuit with high current but low voltage. In addition, the same driver source 180 can be applied in the luminescent light source 100d of this embodiment to drive the blue LED chip 130 and the red LED chip 140.

Figure 3:
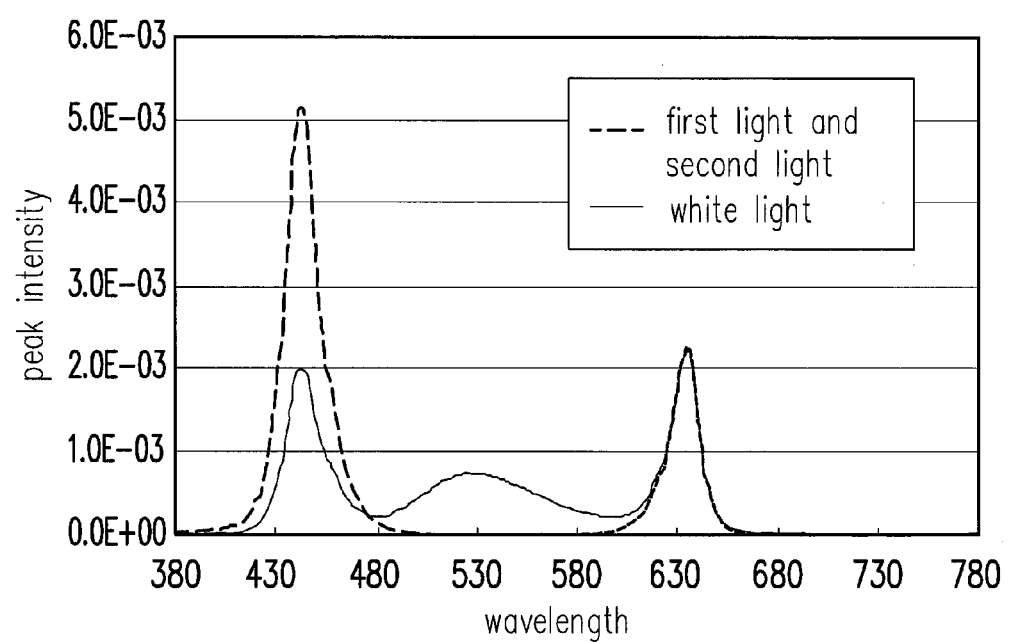
FIG. 3 shows the correlation between peak intensity and a wavelength of light emitted from the luminescent light source according to an embodiment of the invention.

FIG. 3 shows the correlation between the peak intensity and the wavelength of light emitted from the luminescent light source 100a according to an embodiment of the invention. As indicated in FIG. 1A and FIG. 3, the blue LED chip 130 emits the first light L1, and the wavelength of the first light L1 ranges from 440 nm to 470 nm, which falls within the wavelength range of the visible blue light. The red LED chip 140 emits the second light L2, and the wavelength of the second light L2 ranges from 620 nm to 660 nm, which falls within the wavelength range of the visible red light. It can be learned from FIG. 3 that the ratio of the peak intensity of the second light L2 to the peak intensity of the first light L1 ranges from 0.36 to 0.56. That is to say, the peak intensity of the first light L1 is greater than that of the second light L2.

When the wavelength converting material 150 is disposed around the blue LED chip 130, the wavelength converting material 150 absorbs one portion of the first light L1 emitted from the blue LED chip 130 and converts the portion of the first light L1 into the third light L3. In the present embodiment, the wavelength of the third light L3 ranges from the wavelength of the first light L1 to the wavelength of the second light L2. Namely, when the first light L1 enters the wavelength converting material 150, the wavelength converting material 150 absorbs partial energy of the first light L1 and releases the third light L3 with a different wavelength.

The other portion of the first light L1 that is not absorbed by the wavelength converting material 150, the second light L2, and the third light L3 can be mixed to generate a white light W, which is the light emitted from the luminescent light source 100a of the embodiment. It should be mentioned that in this embodiment one portion of the first light L1 is absorbed by the wavelength converting material 150 and converted into the third light L3, and the other portion of the first light L1 is mixed with the second light L2 and the third light L3 to generate the white light W. Accordingly, to provide sufficient optical energy, the intensity of the first light L1 need be greater than that of the second light L2. Here, the ratio of the peak intensity of the second light L2 to the peak intensity of the first light L1 is required to fall within the range from 0.36 to 0.56, for instance. Besides, to ensure the first light L1 to have sufficient intensity, the light emitting area of the blue LED chip 130 may be alternatively greater than the light emitting area of the red LED chip 140.

Through mixing the first light L1, the second light L2, and the third light L3, the generated white light W can serve as the light emitted from the luminescent light source 100. Since the white light W has the NTSC color saturation greater than 90%, the luminescent light source 100a can have favorable color performance. The luminescent light source 100a of this invention may be further applied to a backlight module for supplying the display light to a display. Note that the luminescent light sources 100b, 100c, and 100d described in the previous embodiments can all have the light emitting properties of the luminescent light source 100a, i.e., the requirements for the NTSC color saturation being greater than 90% and for favorable color performance can be satisfied.

Figure 4:
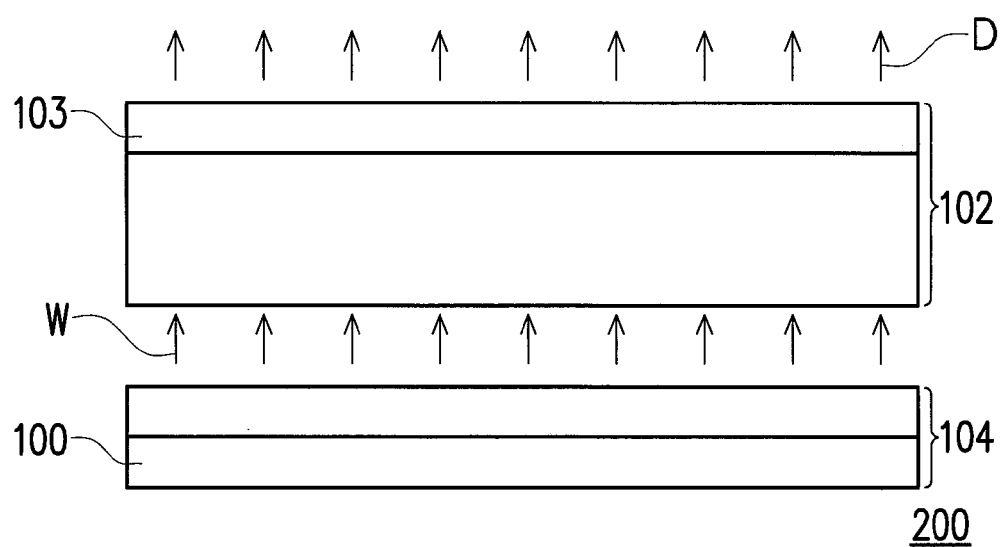
FIG. 4 is a schematic view illustrating a structure of a display according to an embodiment of the invention.

FIG. 4 is a schematic view illustrating a structure of a display 200 according to an embodiment of the invention. With reference to FIG. 4, the display 200 of this embodiment includes a display panel 102 and a backlight module 104. The display panel 102 has a color filter layer 103. The backlight module 104 includes the luminescent light source 100, which may be one or more of the aforesaid luminescent light sources 100a~100d, so as to provide the white light W required by the display panel 102 for displaying images. The white light W emitted from the backlight module 104 passes the color filter layer 103 and then becomes the display light D constituting the display frame. In the display 200 of this embodiment, the NTSC color saturation of the display light D may be greater than 90%, and thus the display 200 can have favorable color performance and satisfactory display quality.

Figure 5:
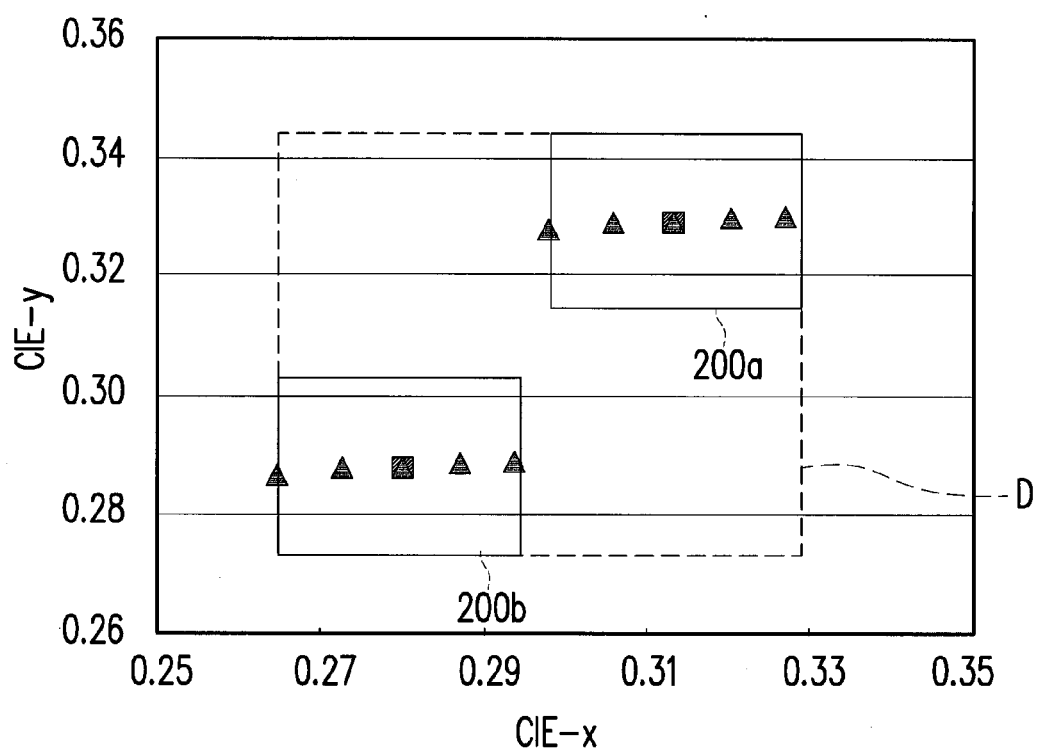
FIG. 5 is a schematic chromaticity coordinate diagram of a display light source in the invention.

FIG. 5 is a schematic CIE 1931 chromaticity coordinate diagram illustrating the display light D exhibited on the display 200 in the invention. With reference to FIG. 5, the existing display (e.g., a notebook computer) often requires the standard white light to have the D65 chromaticity, and the chromaticity coordinates CIEx and CIEy are (0.313, 0.329)±0.015, which fall within the range 200a shown in FIG. 5, for instance. However, the luminance requirement of the early color TV leads to compensation of color with high color temperature. Thus, the common standard of the color TV requires the chromaticity coordinates CIEx and CIEy of the standard white light to be (0.280, 0.288)±0.015, which fall within the range 200b shown in FIG. 5, for instance.

According to the present embodiment, the display light D exhibited on the display 200 has the x-coordinate CIEx and the y-coordinate CIEy on the CIE 1931 chromaticity coordinate diagram, wherein CIEx ranges from 0.265 to 0.328, and CIEy ranges from 0.273 to 0.344. Namely, the display light D exhibited on the display 200 complies with both the requirement of the display 200 and the common standard of the color TV.

To be more specific, the display light D exhibited on the display 200 can have different properties by adjusting the design of the luminescent light source 100. For instance, when the luminescent light source 100 refers to any of the luminescent light sources 100a~100d, the ratio of the peak intensity of the second light L2 to the peak intensity of the first light L1 can range from 0.46 to 0.56 if an appropriate light emitting diode chip is applied. At this time, the display light D formed by the white light W passing the color filter layer 104, has the x-coordinate CIEx and the y-coordinate CIEy on the CIE 1931 chromaticity coordinate diagram, wherein CIEx ranges from 0.298 to 0.328, and CIEy ranges from 0.314 to 0.344 (i.e., within the range 200a). Thus, the display light D is applicable to the existing displays.

Alternatively, the ratio of the peak intensity of the second light L2 to the peak intensity of the first light L1 can also range from 0.36 to 0.44 if an appropriate light emitting diode chip is applied as the luminescent light source 100. Thereby, the display light D formed by the white light W of the luminescent light source 100 passing the color filter layer 104, has the x-coordinate CIEx and the y-coordinate CIEy on the CIE 1931 chromaticity coordinate diagram, wherein CIEx ranges from 0.265 to 0.295, and CIEy ranges from 0.273 to 0.303 (i.e., within the range 200b). Thus, the display light D is applicable to the color TV.

However, the descriptions with respect to the ratio of peak intensity and the range of chromaticity coordinates aim at enabling people having ordinary skill in the art to implement the invention instead of limiting the invention.

In light of the foregoing, the blue LED chip and the red LED chip of the luminescent light source can be connected together in series or in parallel and driven by the same electrical signal according to the embodiments of the invention. Since only one driver source is required for driving the luminescent light source in the invention, the manufacturing costs of the luminescent light source can be reduced. In addition, the ratio of the peak intensity of the light from the red LED chip of the luminescent light source to the peak intensity of the light from the blue LED chip of the luminescent light source is appropriate, such that the luminescent light source is capable of emitting appropriate white light which can serve as the standard of the display light of the display panel and the display thus has the appropriate NTSC color saturation.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A luminescent light source comprising:
   a blue light emitting diode chip emitting a first light;
   a red light emitting diode chip emitting a second light, wherein a ratio of peak intensity of the second light to peak intensity of the first light ranges from 0.36 to 0.56; and
   a wavelength converting material disposed around at least one of the blue light emitting diode chip and the red light emitting diode chip, the wavelength converting material emitting a third light, a wavelength of the third light ranging from a wavelength of the first light to a wavelength of the second light.

2. The luminescent light source as recited in claim 1, further comprising a driver source outputting an electrical signal to drive the blue light emitting diode chip and the red light emitting diode chip.

3. The luminescent light source as recited in claim 1, wherein the first light, the second light, and the third light are mixed to generate a white light.

4. The luminescent light source as recited in claim 1, wherein a light emitting area of the blue light emitting diode chip is greater than a light emitting area of the red light emitting diode chip.

5. The luminescent light source as recited in claim 1, wherein the wavelength converting material is green phosphor powder, yellow phosphor powder, or a combination thereof.

6. The luminescent light source as recited in claim 1, wherein the wavelength converting material comprises an orthosilicate phosphor material, β-SiAlON, an oxynitride-based phosphor material, an yttrium aluminum garnet phosphor material, a nitride phosphor material, a sulfate phosphor material, $CaSc_2O_4$, or a combination thereof.

7. The luminescent light source as recited in claim 3, wherein an NTSC color saturation of the white light is greater than 90%.

8. The luminescent light source as recited in claim 1, further comprising an encapsulant encapsulating the blue light emitting diode chip and the red light emitting diode chip.

9. The luminescent light source as recited in claim 8, wherein the wavelength converting material is doped into the encapsulant.

10. The luminescent light source as recited in claim 1, wherein the wavelength converting material is disposed on peripheries of the blue light emitting diode chip.

11. The luminescent light source as recited in claim 1, wherein the wavelength converting material is disposed on a light emitting surface of the blue light emitting diode chip.

12. The luminescent light source as recited in claim 1, wherein the blue light emitting diode chip and the red light emitting diode chip are connected in series or in parallel.

13. The luminescent light source as recited in claim 1, wherein the ratio of the peak intensity of the second light to the peak intensity of the first light ranges from 0.46 to 0.56.

14. The luminescent light source as recited in claim 1, wherein the ratio of the peak intensity of the second light to the peak intensity of the first light ranges from 0.36 to 0.44.

15. A display comprising:
    a display panel having a color filter layer; and
    a luminescent light source providing the display panel with a display light and comprising:
        a blue light emitting diode chip emitting a first light;
        a red light emitting diode chip emitting a second light, wherein a ratio of peak intensity of the second light to peak intensity of the first light ranges from 0.36 to 0.56; and
        a wavelength converting material disposed around at least one of the blue light emitting diode chip and the red light emitting diode chip, the wavelength converting material being excited to emit a third light, wherein the first light, the second light, and the third light are mixed to generate the display light, the display light has an x-coordinate CIEx and a y-coordinate CIEy on a CIE 1931 chromaticity coordinate diagram after passing through the color filter layer, CIEx ranges from 0.265 to 0.328, and CIEy ranges from 0.273 to 0.344.

16. The display as recited in claim 15, wherein the display light has the x-coordinate CIEx and the y-coordinate CIEy on the CIE 1931 chromaticity coordinate diagram after passing through the color filter layer, CIEx ranges from 0.298 to 0.328, and CIEy ranges from 0.314 to 0.344.

17. The display as recited in claim 15, wherein the display light has the x-coordinate CIEx and the y-coordinate CIEy on the CIE 1931 chromaticity coordinate diagram after passing through the color filter layer, CIEx ranges from 0.265 to 0.295, and CIEy ranges from 0.273 to 0.303.

18. The display as recited in claim 15, wherein the ratio of the peak intensity of the second light of the luminescent light source to the peak intensity of the first light of the luminescent light source ranges from 0.46 to 0.56.

19. The display as recited in claim 15, wherein the ratio of the peak intensity of the second light of the luminescent light source to the peak intensity of the first light of the luminescent light source ranges from 0.36 to 0.44.

* * * * *